(12) United States Patent
Sun et al.

(10) Patent No.: US 12,745,386 B2
(45) Date of Patent: Sep. 22, 2026

(54) SEMICONDUCTOR APPARATUS HAVING MULTI-LAYERED BIT LINE CONTACT AND MANUFACTURING METHOD OF THE SAME

(71) Applicant: SAMSUNG ELECTRONICS CO., LTD., Suwon-si (KR)

(72) Inventors: Sangkyu Sun, Suwon-si (KR); Hyunyong Kim, Suwon-si (KR); Hyun-Jung Kim, Suwon-si (KR); Junhee Park, Suwon-si (KR); Kyuwon Woo, Suwon-si (KR); Jiwon Oh, Suwon-si (KR); Yoonyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 18/216,745

(22) Filed: Jun. 30, 2023

(65) Prior Publication Data

US 2024/0179893 A1 May 30, 2024

(30) Foreign Application Priority Data

Nov. 30, 2022 (KR) ........................ 10-2022-0164316

(51) Int. Cl.
*H10B 12/00* (2023.01)

(52) U.S. Cl.
CPC ......... *H10B 12/485* (2023.02); *H10B 12/053* (2023.02); *H10B 12/315* (2023.02); *H10B 12/34* (2023.02); *H10B 12/482* (2023.02)

(58) Field of Classification Search
CPC ..... H10B 12/053; H10B 12/34; H10B 12/315
See application file for complete search history.

(56) References Cited

U.S. PATENT DOCUMENTS

| | | | | |
|---|---|---|---|---|
| 9,087,728 | B2 | 7/2015 | Chung et al. | |
| 9,142,536 | B2 | 9/2015 | Kim | |
| 2014/0134837 | A1 | 5/2014 | Kim | |
| 2020/0203354 | A1* | 6/2020 | Lee | H10B 12/315 |
| 2021/0134804 | A1* | 5/2021 | Jung | H10B 12/315 |

(Continued)

FOREIGN PATENT DOCUMENTS

| | | | |
|---|---|---|---|
| CN | 115020377 | A | 9/2022 |
| KR | 1020160068067 | A | 6/2016 |

(Continued)

*Primary Examiner* — Steven M Page
(74) *Attorney, Agent, or Firm* — Muir Patent Law, PLLC

(57) ABSTRACT

A semiconductor device includes a substrate that includes an element separation film, an active region defined by the element separation film and arranged in a first direction, and a trench positioned across the active region and the element separation film, a bit line contact that is positioned within the trench and is connected to the active region, a bit line structure that is connected to the substrate through the bit line contact and that extends in a second direction different from the first direction across the active region, and a first contact spacer, a second contact spacer, and a third contact spacer within the trench and around the bit line contact, the first contact spacer being continuous within the trench, and each of the second contact spacer and the third contact spacer being separated into at least two discrete parts within the trench.

11 Claims, 15 Drawing Sheets

(56) References Cited

U.S. PATENT DOCUMENTS

2021/0217625 A1* 7/2021 Chung .................. H10P 50/283
2022/0077002 A1 3/2022 Yoon et al.
2022/0157822 A1* 5/2022 Ahn ....................... H10B 12/34

FOREIGN PATENT DOCUMENTS

KR 10-1994078 B1 7/2019
KR 10-2022-0047547 A 4/2022

* cited by examiner

SEMICONDUCTOR APPARATUS HAVING MULTI-LAYERED BIT LINE CONTACT AND MANUFACTURING METHOD OF THE SAME

CROSS-REFERENCE TO RELATED APPLICATION

This application claims priority to and the benefit of Korean Patent Application No. 10-2022-0164316, filed in the Korean Intellectual Property Office on Nov. 30, 2022, the entire contents of which are incorporated herein by reference.

BACKGROUND

1. Field

The present disclosure relates to a semiconductor device having a multi-layered bit line contact and a manufacturing method of the same.

2. Description of the Related Art

As a semiconductor device is increasingly highly integrated, individual circuit patterns are becoming more miniaturized in order to implement more semiconductor devices in a same area. Accordingly, an allowable range of a process error of a component of the semiconductor device is decreasing.

In a highly integrated semiconductor device, a process of forming numerous wiring lines and numerous contacts for connecting the wiring lines to circuit elements is becoming increasingly complex and difficult. In addition, the allowable range of the process error of the component of the semiconductor device is reduced so that difficulty of a process is further increased.

SUMMARY

A semiconductor device according to an embodiment may include a substrate that includes an element separation film, an active region defined by the element separation film and arranged in a first direction, and a trench positioned across the active region and the element separation film; a bit line contact that is positioned within the trench and is connected to the active region; a bit line structure that is connected to the substrate through the bit line contact and that extends in a second direction different from the first direction across the active region; and a first contact spacer, a second contact spacer, and a third contact spacer that are positioned within the trench and are positioned around the bit line contact. The first contact spacer is continuously formed within the trench, and each of the second contact spacer and the third contact spacer is separated into at least two parts within the trench. The second gap insulating film may include at least one of a silicon nitride, a silicon nitrate, a silicon carbonitride, a silicon oxycarbide nitride, and a silicon carbide.

A manufacturing method of a semiconductor device according to an embodiment may include forming a trench at a substrate; forming a first contact spacer, a second contact spacer, and a third contact spacer at an inner wall of the trench; forming a direct contact film filling a remaining portion of the trench at which the first contact spacer, the second contact spacer, and the third contact spacer are formed; forming a bit line structure on the direct contact film; forming a first gap by removing the second contact spacer exposed outside the bit line structure; and forming a bit line contact by etching the third contact spacer exposed through the first gap and the direct contact film. The third contact spacer includes a different material from a material of the direct contact film. The forming of the first contact spacer, the second contact spacer, and the third contact spacer at the inner wall of the trench may include: continuously depositing a first contact spacer film and a second contact spacer film and etching the deposited first contact spacer film and second contact spacer film together to form the first contact spacer and the second contact spacer; and forming the third contact spacer by depositing and etching a third contact spacer film covering the first contact spacer and the second contact spacer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
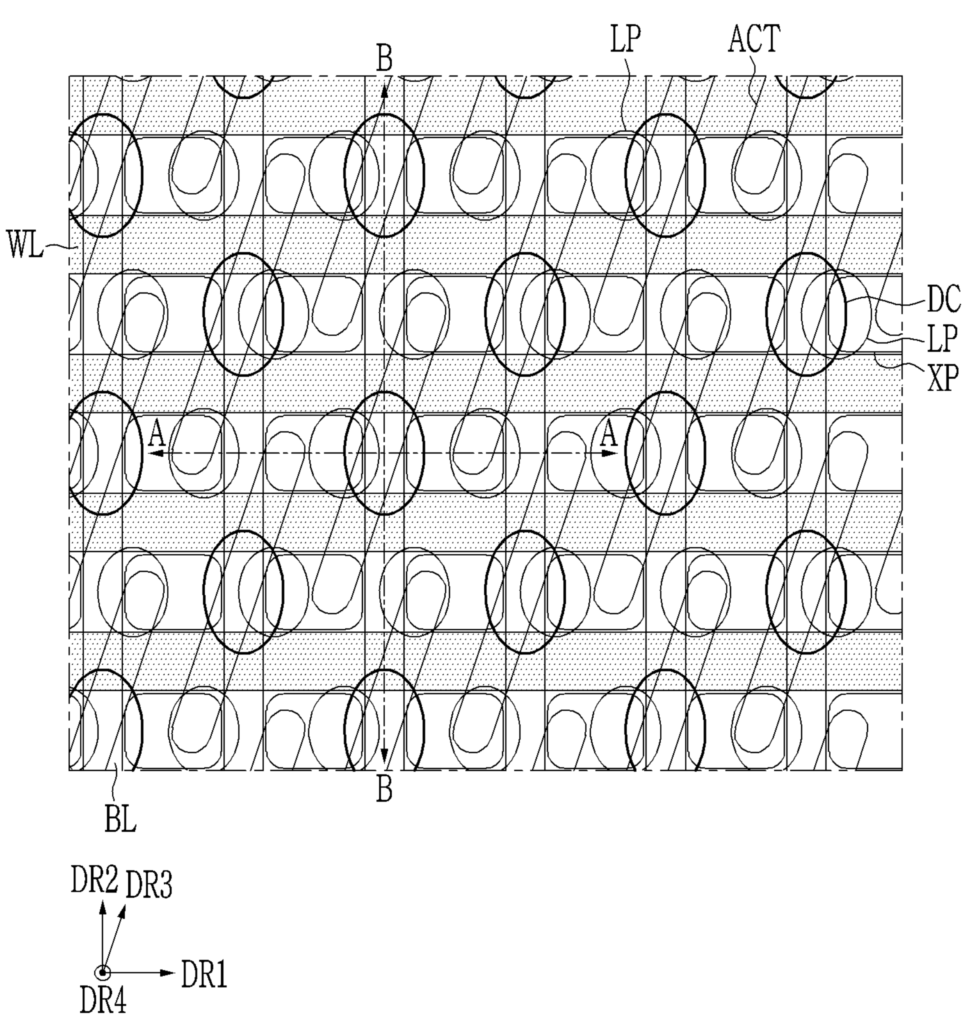
FIG. 1 is a layout view of a semiconductor device according to embodiments.

Embodiments will be described more fully hereinafter with reference to the accompanying drawings. In the drawings, the thicknesses of some layers and regions may be exaggerated for better understanding and ease of description.

Figure 2:
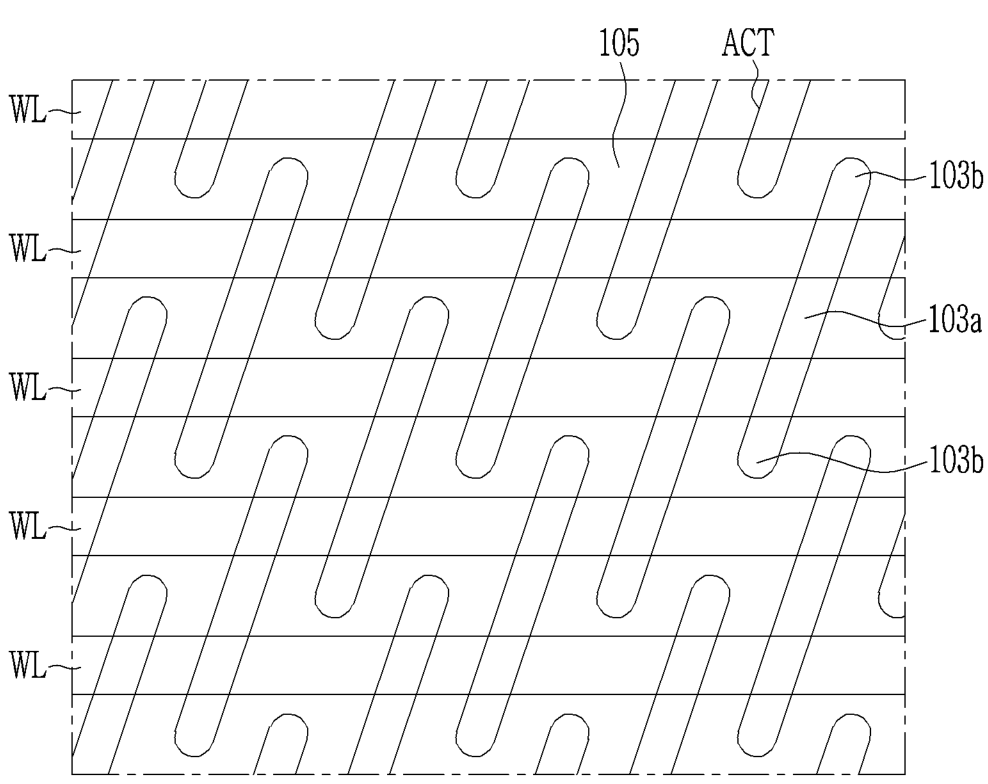
FIG. 2 is a layout view showing only word lines and active regions of FIG. 1.
Figure 2:
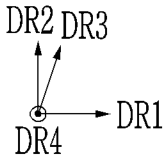
Figure 3:
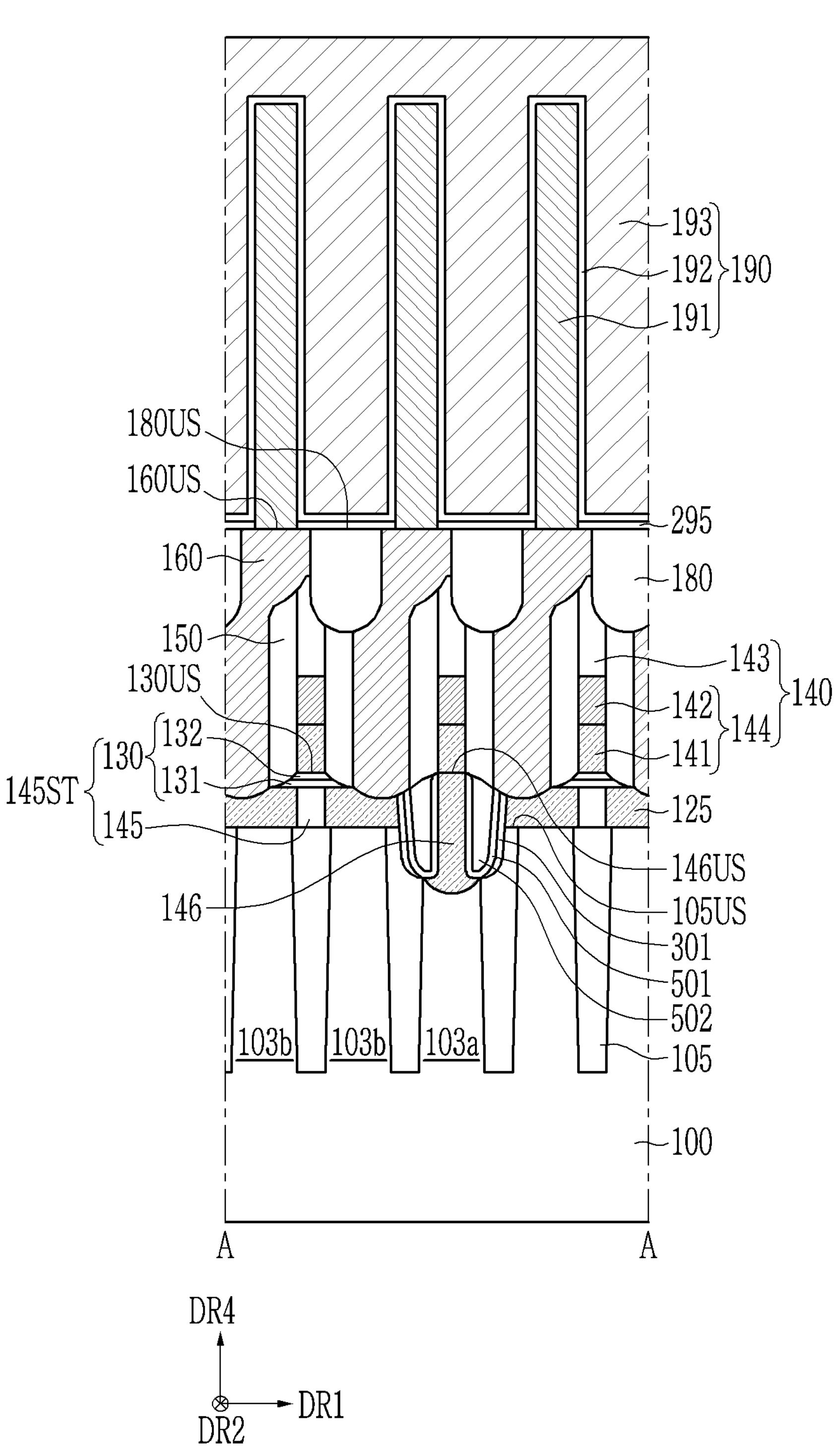
FIG. 3 is a cross-sectional view taken along line A-A of FIG. 1.
Figure 4:
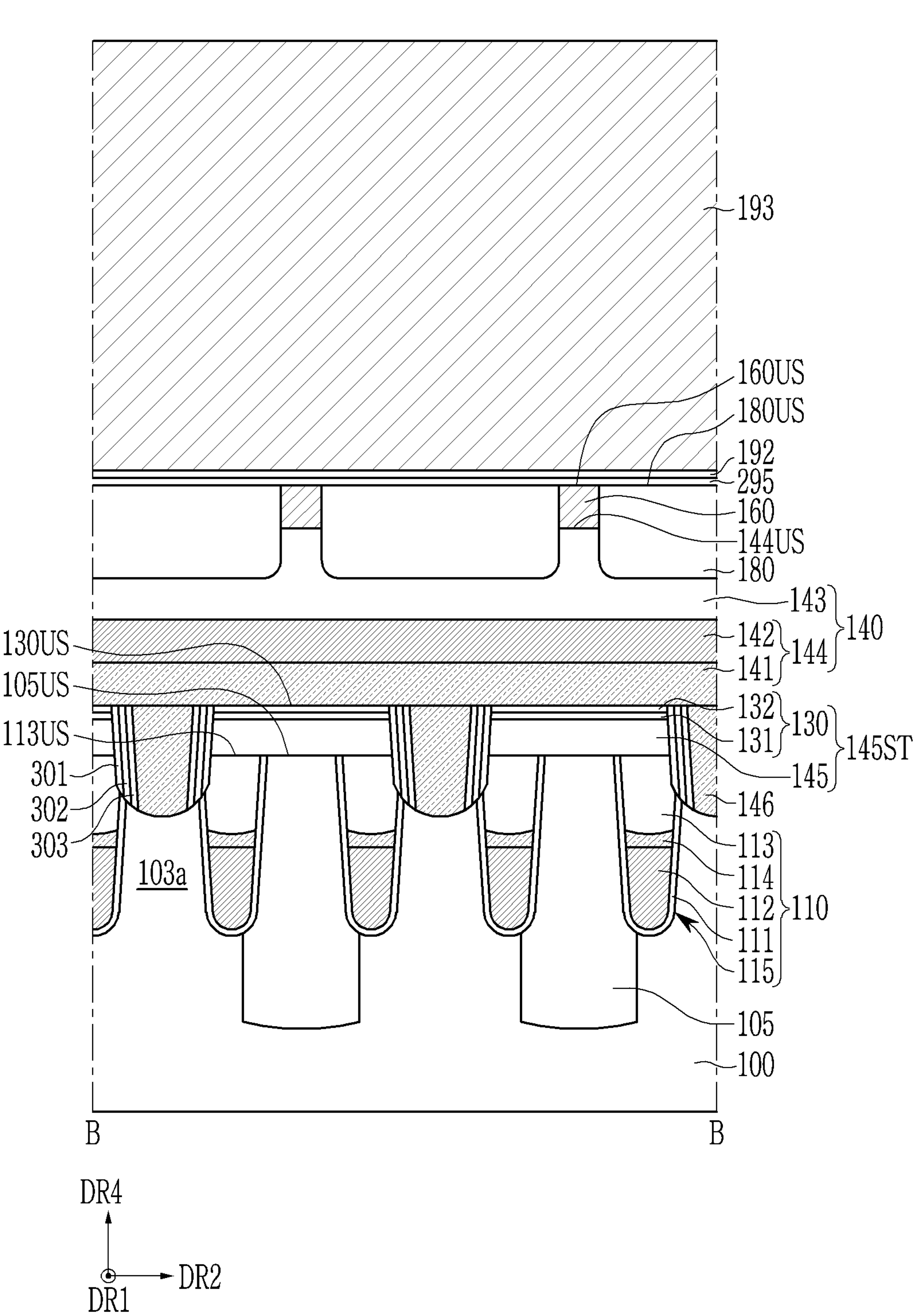
FIG. 4 is a cross-sectional view taken along line B-B of FIG. 1.

FIG. 1 is a layout view of a semiconductor device according to embodiments. FIG. 2 is a layout view showing only word lines and active regions of FIG. 1. FIG. 3 is a cross-sectional view taken line along A-A of FIG. 1. FIG. 4 is a cross-sectional view taken along line B-B of FIG. 1.

Referring to FIGS. 1 and 2, a semiconductor device according to embodiments may include a plurality of cell active regions ACT (e.g., active regions). The cell active region ACT may be defined by a cell element separation film 105 (e.g., an element separation film) formed within a substrate 100 (FIG. 3).

As shown in FIGS. 1 and 2, as a design rule of the semiconductor device decreases, the cell active region ACT may be disposed in a diagonal-line or oblique-line bar shape. For example, the cell active region ACT may extend in a third direction DR3.

A plurality of gate electrodes extending in a first direction DR1 across the cell active region ACT may be disposed. The plurality of gate electrodes may extend parallel to each other. For example, the plurality of gate electrodes may be a plurality of word lines WL. The word lines WL may be disposed at equal intervals. A width of the word line WL or an interval between the word lines WL may be determined according to the design rule.

For example, each cell active region ACT may be divided into three portions by two word lines WL extending in the first direction DR1. The cell active region ACT may include a storage connection region 103*b* and a bit line connection region 103*a*. The bit line connection region 103*a* may be positioned at a center portion of the cell active region ACT, and the storage connection region 103*b* may be positioned at an end portion of the cell active region ACT.

For example, the bit line connection region 103*a* may be a region connected to a bit line BL, and the storage connection region 103*b* may be a region connected to an information storage part 190 (FIG. 3). In other words, the bit line connection region 103*a* may correspond to a common drain region, and the storage connection region 103*b* may correspond to a source region. Each word line WL, and the bit line connection region 103*a* and the storage connection region 103*b* adjacent to each word line WL, may constitute a transistor.

A plurality of bit lines BL extending in a second direction DR2 perpendicular to the word line WL may be disposed above the word line WL. The plurality of bit lines BL may extend parallel to each other. The bit lines BL may be disposed at equal intervals. A width of the bit line BL or an interval between the bit lines BL may be determined according to the design rule.

A fourth direction DR4 may be orthogonal to the first direction DR1, the second direction DR2, and the third direction DR3. The fourth direction DR4 may be a thickness direction of the substrate 100.

Semiconductor devices according to some embodiments may include various contact arrangements formed above the cell active region ACT. For example, the various contact arrangements may include a direct contact DC, a node pad XP, a landing pad LP, and the like.

Here, the direct contact DC may refer to a contact electrically connecting the cell active region ACT to the bit line BL. The node pad XP may be a connection pad connecting the cell active region ACT to a lower electrode 191 (FIG. 3) of an information storage part 190 (e.g., a capacitor). In an arrangement structure, a contact area between the node pad XP and the cell active region ACT may be small. Accordingly, a conductive landing pad LP may be introduced to increase a contact area with the cell active region ACT and to increase a contact area with the lower electrode 191.

The landing pad LP may be disposed between the node pad XP and the lower electrode 191 of a capacitor. Contact resistance between the cell active region ACT and the lower electrode 191 of the capacitor may be reduced by increasing the contact area through introduction of the landing pad LP.

The direct contact DC may be connected to the bit line connection region 103*a*. The node pad XP may be connected to the storage connection region 103*b*.

As the node pad XP is disposed at both ends of the cell active region ACT, the landing pad LP may be disposed adjacent to both ends of the cell active region ACT to at least partially overlap the node pad XP. In other words, the node pad XP may be formed to overlap the cell active region ACT and the cell element separation film 105 disposed between adjacent word lines WL and between adjacent bit lines BL.

The word line WL may be formed in a structure buried within the substrate 100. The word line WL may be disposed across the cell active region ACT between the direct contact DC and one of the node pads XP. As shown in the drawings, two word lines WL may be disposed to cross one cell active region ACT. Since the cell active region ACT extends along the third direction DR3, the word line WL may have an angle of less than 90 degrees with respect to the cell active region ACT.

The direct contacts DC and the node pads XP may be symmetrically disposed. Accordingly, the direct contact DC and the node pad XP may be disposed on a straight line along the first and second directions DR1 and DR2. On the one hand, unlike the direct contact DC and the node pad XP, the landing pad LP may be disposed in a zigzag shape in the second direction DR2 in which the bit line BL extends. In addition, the landing pad LP may be disposed to overlap the same side portion of each bit line BL in the first direction DR1 in which the word line WL extends.

For example, each of the landing pads LP of a first line may overlap a left side of the bit line BL corresponding to each of the landing pads LP of the first line, and each of the landing pads LP of a second line may overlap a right side of the bit line BL corresponding to each of the landing pads LP of the second line.

Referring to FIGS. 1 to 4, the semiconductor device according to the embodiment may include a plurality of cell gate structures 110, a plurality of bit line structures 140, a plurality of node connection pads 125, a plurality of bit line contacts 146, and the information storage part 190. First to third contact spacers 301, 302, and 303 may be disposed at side surfaces of the plurality of bit line contacts 146.

For example, the substrate 100 may be a silicon substrate or a silicon-on-insulator (SOI). In another example, the substrate 100 may include a silicon germanium, a silicon germanium on insulator (SGOI), an indium antimonide, a lead tellurium compound, an indium arsenide, an indium phosphide, a gallium arsenide, or a gallium antimonide.

The cell element separation film 105 may be formed in the substrate 100. The cell element separation film 105 may have a shallow trench isolation (STI) structure having an excellent element separation characteristic. The cell element separation film 105 may define the cell active region ACT within a memory cell region.

As shown in FIGS. 1 and 2, the cell active region ACT defined by the cell element separation film 105 may have a long island shape including a short axis and a long axis. The cell active region ACT may have an oblique shape to have an angle of less than 90 degrees with respect to the word line WL formed within the cell element separation film 105. In addition, the cell active region ACT may have an oblique shape to have an angle of less than 90 degrees with respect to the bit line BL formed above the cell element separation film 105.

For example, the cell element separation film 105 may include at least one of a silicon oxide film, a silicon nitride film, and a silicon nitrate film. Although the cell element separation film 105 is illustrated as being formed of one insulating film, this is only for convenience of explanation, and the cell element separation film is not limited thereto. Depending on a separation distance between adjacent cell active regions ACT, the cell element separation film 105 may be formed of one insulating film or a plurality of insulating films. For example, as illustrated in FIG. 3, an upper surface 105US of the cell element separation film 105 and an upper surface of the substrate 100 may be coplanar.

The cell gate structure 110 may be formed within the substrate 100 and the cell element separation film 105. The cell gate structure 110 may be formed across the cell element separation film 105 and the cell active region ACT defined by the cell element separation film 105. The cell gate structure 110 may include a cell gate trench 115, a cell gate insulating film 111, a cell gate electrode 112, a cell gate capping pattern 113, and a cell gate capping conductive film 114.

Here, the cell gate electrode 112 may correspond to the word line WL. For example, the cell gate electrode 112 may be the word line WL of FIG. 1. Unlike what is shown in the drawings, the cell gate structure 110 may not include the cell gate capping conductive film 114.

For example, the cell gate trench 115 may be relatively deep within the cell element separation film 105, and may be relatively shallow within the cell active regions ACT. A bottom surface of the word line WL may be curved. That is, a depth of the cell gate trench 115 in the cell element separation film 105 may be greater than a depth of the cell gate trench 115 in the cell active region ACT.

The cell gate insulating film 111 may extend along a sidewall and a bottom surface of the cell gate trench 115. The cell gate insulating film 111 may extend along a profile of at least a portion of the cell gate trench 115.

For example, the cell gate insulating film 111 may include at least one of a silicon oxide, a silicon nitride, a silicon nitrate, and a high permittivity material having a higher dielectric constant than a silicon oxide. For example, the high permittivity material may include at least one of a boron nitride, a hafnium oxide, a hafnium silicon oxide, a hafnium aluminum oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, a lead zinc niobate, and a combination thereof.

The cell gate electrode 112 may be disposed on the cell gate insulating film 111. The cell gate electrode 112 may fill a portion of the cell gate trench 115. The cell gate capping conductive film 114 may extend along an upper surface of the cell gate electrode 112.

The cell gate electrode 112 may include at least one of a metal, a metal alloy, a conductive metal nitride, a conductive metal carbonitride, a conductive metal carbide, a metal silicide, a doped semiconductor material, a conductive metal nitrate, and a conductive metal oxide. For example, the cell gate electrode 112 may include at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and a combination thereof.

For example, the cell gate capping conductive film 114 may include one of a polysilicon, a polysilicon-germanium, an amorphous silicon, and an amorphous silicon-germanium. For example, the cell gate capping conductive film 114 may be between the cell gate capping pattern 113 and the cell gate electrode 112.

The cell gate capping pattern 113 may be disposed above the cell gate electrode 112 and the cell gate capping conductive film 114. The cell gate capping pattern 113 may fill the cell gate trench 115 remaining after the cell gate electrode 112 and the cell gate capping conductive film 114 are formed. For example, the cell gate insulating film 111 may extend along a sidewall of the cell gate capping pattern 113.

For example, the cell gate capping pattern 113 may include at least one of a silicon nitride (SiN), a silicon nitrate (SiON), a silicon oxide ($SiO_x$), a silicon carbonitride (SiCN), a silicon oxycarbide nitride (SiOCN), and a combination thereof. For example, an upper surface 113US of the cell gate capping pattern may be coplanar with an upper surface 105US of the cell element separation film 105.

For example, an impurity doped region may be formed at at least one side of the cell gate structure 110. The impurity doped region may be a source/drain region of the transistor. The impurity doped region may be formed at the storage connection region 103*b* and the bit line connection region 103*a* of FIG. 2.

In FIG. 2, when the transistor including each word line WL, and the bit line connection region 103*a* and the storage connection region 103*b* adjacent to each word line WL, is an NMOS transistor, the storage connection region 103*b* and the bit line connection region 103*a* may include a doped n-type impurity, e.g., at least one of phosphorus (P), arsenic (As), antimony (Sb), and bismuth (Bi). When the transistor including each word line WL, and the bit line connection region 103*a* and the storage connection region 103*b* adjacent to each word line WL, is a PMOS transistor, the storage connection region 103*b* and the bit line connection region 103*a* may include a doped p-type impurity, e.g., boron (B).

The bit line structure 140 may include a cell conductive line 144 and a cell line capping film 143. The cell conductive line 144 may be disposed above the substrate 100 at which the cell gate structure 110 is formed and above the cell element separation film 105. The cell conductive line 144 may cross the cell element separation film 105 and the cell active region ACT defined by the cell element separation film 105. The cell conductive line 144 may be formed to cross the cell gate structure 110. Here, the cell conductive line 144 may correspond to the bit line BL. For example, the cell conductive line 144 may be the bit line BL of FIG. 1.

For example, the cell conductive line 144 may include a first cell conductive film 141 and a second cell conductive film 142 stacked on top of each other. Each of the first and second cell conductive films 141 and 142 may include at least one of a semiconductor material doped with an impurity, a conductive silicide compound, a conductive metal nitride, a two-dimensional (2D) material, a metal, and a metal alloy. In semiconductor devices according to some embodiments, the 2D material may be a metallic material and/or a semiconductor material. The 2D material may include a 2D allotrope or a 2D compound. For example, the 2D material may include at least one of a graphene, molybdenum disulfide ($MoS_2$), molybdenum diselenide ($MoSe_2$), tungsten diselenide ($WSe_2$), and tungsten disulfide ($WS_2$).

For example, each of the first cell conductive film 141 and the second cell conductive film 142 may include a polysilicon, TiN, TiSiN, tungsten, a tungsten silicide, or a combination thereof. For example, the first cell conductive film 141 may include TiSiN, and the second cell conductive film 142 may include tungsten.

The cell line capping film 143 may be disposed on the cell conductive line 144. The cell line capping film 143 may extend in the second direction DR2 along an upper surface of the cell conductive line 144. For example, the cell line capping film 143 may include at least one of a silicon nitride, a silicon nitrate, a silicon carbonitride, and a silicon oxycarbide nitride.

In semiconductor devices according to some embodiments, the cell line capping film 143 may include a silicon nitride film. Although the cell line capping film 143 is illustrated as a single film in the drawings, the cell line capping film 143 may include a plurality of films, e.g., three silicon nitride films having different film qualities or the like.

The bit line contact 146 may be formed between the cell conductive line 144 and the substrate 100. The cell conductive line 144 may be disposed on the bit line contact 146.

The bit line contact 146 may be disposed, e.g., directly, between the bit line connection region 103*a* of the cell active region ACT and the cell conductive line 144, e.g., in the fourth direction DR4. The bit line contact 146 may be disposed between the cell gate electrodes 112 adjacent to each other in the second direction DR2. The bit line contact 146 may be directly connected to the bit line connection region 103*a*.

When viewed from a plan view, the bit line contact 146 may have a circular or elliptical shape. A planar area of the bit line contact 146 may be greater than an area in which the bit line connection region 103*a* overlaps one cell conductive line 144. The planar area of the bit line contact 146 may be greater than a planar area of one bit line connection region 103*a*.

The bit line contact 146 may electrically connect the cell conductive line 144 and the substrate 100. Here, the bit line contact 146 may correspond to the direct contact DC. For example, the bit line contact 146 may include a semiconductor material doped with an impurity.

The node connection pad 125 may be disposed on the substrate 100. The node connection pad 125 may be disposed on the storage connection region 103*b* of the cell active region ACT. The node connection pad 125 is connected to the storage connection region 103*b*.

The node connection pad 125 may be disposed between the cell conductive lines 144 adjacent to each other in the first direction DR1. For example, the node connection pad 125 may be disposed between the cell gate electrodes 112 adjacent to each other in the second direction DR2.

An upper surface 125US of the node connection pad is lower than an upper surface 146US of the bit line contact based on the upper surface 105US of the cell element separation film, e.g., the upper surface 125US of the node connection pad is lower than the upper surface 146US relative to a bottom of the substrate 100. The upper surface 125US of the node connection pad is lower than a bottom surface of the cell conductive line 144 based on the upper surface 105US of the cell element separation film, e.g., the upper surface 125US of the node connection pad is lower than a bottom surface of the cell conductive line 144 relative to the bottom of the substrate 100.

The node connection pad 125 may electrically connect the information storage part 190 and the substrate 100. Here, the node connection pad 125 may correspond to the node pad XP. For example, the node connection pad 125 may include at least one of a semiconductor material doped with an impurity, a conductive silicide compound, a conductive metal nitride, a metal, and a metal alloy.

A pad separation structure 145ST may separate the node connection pads 125 adjacent to each other in the first direction DR1, as illustrated in FIG. 3. For example, the pad separation structure 145ST may separate the node connection pads 125 adjacent to each other in the second direction DR2.

The pad separation structure 145ST may include a pad separation pattern 145 and an upper cell insulating film 130. The upper cell insulating film 130 may be disposed on the pad separation pattern 145.

When the node connection pad 125 includes a first node connection pad and a second node connection pad spaced apart in the first direction DR1, the pad separation pattern 145 may separate the first node connection pad and the second node connection pad in the first direction DR1. For example, the pad separation pattern 145 may also separate the node connection pads 125 adjacent to each other in the second direction DR2.

When the node connection pad 125 includes the first node connection pad and the second node connection pad spaced apart in the first direction DR1, the upper cell insulating film 130 may cover an upper surface of the first node connection pad and an upper surface of the second node connection pad.

An upper surface 130US of the upper cell insulating film may be on the same plane as an upper surface 146US of the bit line contact. That is, a height of the upper surface 130US of the upper cell insulating film may be the same as a height of the upper surface 146US of the bit line contact based on the upper surface 105US of the cell element separation film, e.g., relative to a bottom surface of the substrate 100.

The pad separation pattern 145 and the upper cell insulating film 130 may be disposed between the bit line contacts 146 adjacent to each other in the second direction DR2. The cell conductive line 144 may be disposed on an upper surface of the pad separation structure 145ST. The cell conductive line 144 may be disposed on the upper surface 130US of the upper cell insulating film. The upper surface of the pad separation structure 145ST may be the upper surface 130US of the upper cell insulating film. The upper surface of the pad separation structure 145ST may be on the same plane as the bottom surface of the cell conductive line 144.

In FIG. 3, the first contact spacer 301 and first and second gap insulating films 501 and 502 may be positioned between the cell element separation film 105, the node connection pad 125 on the cell element separation film 105, and the bit line contact 146. In FIG. 4, the first to third contact spacers 301, 302, and 303 may be disposed between the cell gate capping pattern 113 and the bit line contact 146, and between the pad separation structure 145ST on the cell gate capping pattern 113 and the bit line contact 146.

In detail, referring to FIGS. 3 and 4, the first contact spacer 301 may be disposed in all directions around the bit line contact 146. For example, the first contact spacer 301 may extend continuously around, e.g., an entire perimeter of, the bit line contact 146, e.g., the first contact spacer 301 may be integrally formed within the trench to be continuous within the trench. Referring to FIG. 4, the second and third contact spacers 302 and 303 may be positioned only below the bit line structure 140 and may not exist at a position outside the bit line structure 140. That is, the second and third contact spacers 302 and 303 may exist only at positions vertically overlapping the bit line structure 140, e.g., under the bit line structure 140, in the fourth direction DR4. Accordingly, the first contact spacer 301 may be seen in both FIG. 3 that is the cross-sectional view taken along A-A of FIG. 1 and FIG. 4 that is the cross-sectional view taken along the line B-B of FIG. 1, but the second and third contact spacers 302 and 303 may not be seen in FIG. 3 that is the cross-sectional view taken along A-A of FIG. 1 and may be seen in FIG. 4 that is the cross-sectional view taken along the line B-B of FIG. 1. This is because the bit line contact 146 is formed using the second contact spacer 302 as a sacrificial film, and thus detailed description thereof will be described later.

The first gap insulating film 501 may be a film formed along an inner surface of a gap between the first contact spacer 301 and the bit line contact 146, and the second gap insulating film 502 may have a shape filling a groove formed by the first gap insulating film 501. The first gap insulating film 501 may include an oxide, e.g., a silicon oxide ($SiO_x$) or the like, and the second gap insulating film 502 may include at least one of a silicon oxide, a silicon nitride, a silicon nitrate (SiON), and a silicon oxycarbide nitride (SiOCN).

For example, each of the first and third contact spacers 301 and 303 may include at least one of a silicon nitride (SiN), a silicon nitrate (SiON), a silicon carbonitride (SiCN), a silicon oxycarbide nitride (SiOCN), and a silicon carbide (SiOC). For example, the second contact spacer 302 may include an oxide, e.g., a silicon oxide ($SiO_x$) or the like.

For example, the pad separation pattern 145 may include at least one of a silicon nitride (SiN), a silicon nitrate (SiON), a silicon oxide ($SiO_x$), a silicon carbonitride (SiCN), a silicon oxycarbide nitride (SiOCN), and a combination thereof. The upper cell insulating film 130 may be a single film, but as shown in the drawings, the upper cell insulating film 130 may be a multi-film including a first upper cell insulating film 131 and a second upper cell insulating film 132. For example, the first upper cell insulating film 131 may include a silicon oxide film, and the second upper cell insulating film 132 may include a silicon nitride film, but the first upper cell insulating film and the second upper cell insulating film are not limited thereto. A width of the upper cell insulating film 130 in the first direction DR1 is shown to decrease as a distance from the substrate 100 increases, but is not limited thereto.

A bit line spacer 150 may be disposed on sidewalls of the cell conductive line 144 and the cell line capping film 143. At a portion of the cell conductive line 144 where the bit line contact 146 is formed, the bit line spacer 150 may be disposed on sidewalls of the cell conductive line 144, the cell line capping film 143, and the bit line contact 146. At a remaining portion of the cell conductive line 144 where the bit line contact 146 is not formed, the bit line spacer 150 may be disposed on the upper cell insulating film 130.

Although the bit line spacer 150 is illustrated as a single film, it may have a multi-film structure. For example, the bit line spacer 150 may include one of a silicon oxide film, a silicon nitride film, a silicon nitrate film (SiON), a silicon oxycarbide nitride film (SiOCN), air, and a combination thereof.

A storage pad 160 may be disposed on each node connection pad 125. The storage pad 160 may be electrically connected to the node connection pad 125. The storage pad 160 may be connected to the storage connection region 103*b* of the cell active region ACT. Here, the storage pad 160 may correspond to the landing pad LP.

In the semiconductor device according to an embodiment, the storage pad 160 may extend to the node connection pad 125 to be connected to the node connection pad 125. The storage pad 160 may overlap a portion of an upper surface of the bit line structure 140. For example, the storage pad 160 may include at least one of a semiconductor material doped with an impurity, a conductive silicide compound, a conductive metal nitride, a conductive metal carbide, a metal, and a metal alloy.

A pad separation insulating film 180 may be formed on the storage pad 160 and the bit line structure 140. For example, the pad separation insulating film 180 may be disposed on the cell line capping film 143. The pad separation insulating film 180 may define a plurality of isolation regions where the storage pad 160 is positioned.

The pad separation insulating film 180 does not cover an upper surface 160US of the storage pad. The pad separation insulating film 180 may fill a pad separation recess. The pad separation recess may separate adjacent storage pads 160. For example, the upper surface 160US of the storage pad may be on the same plane as an upper surface 180US of the pad separation insulating film.

The pad separation insulating film 180 may include an insulating material, and may electrically separate a plurality of storage pads 160 from each other. For example, the pad separation insulating film 180 may include at least one of a silicon oxide film, a silicon nitride film, a silicon nitrate film, a silicon oxycarbide nitride film, and a silicon carbonitride film.

An etch stop film 295 may be disposed on the storage pad 160 and the pad separation insulating film 180. The etch stop film 295 may include at least one of a silicon nitride film, a silicon carbonitride film, a silicon boron nitride (SiBN) film, a silicon nitrate film, and a silicon carbonate film.

The information storage part 190 may be disposed on the storage pad 160. The information storage part 190 may be electrically connected to the storage pad 160. A portion of the information storage part 190 may be disposed within the etch stop film 295.

For example, the information storage part 190 may include a capacitor. The information storage part 190 may include the lower electrode 191, a capacitor dielectric film 192, and an upper electrode 193. For example, the upper electrode 193 may be a plate upper electrode having a plate shape.

The lower electrode 191 may be disposed on the storage pad 160. The lower electrode 191 is illustrated as having a pillar shape, but may have any other suitable shape, e.g., a cylinder shape.

The capacitor dielectric film 192 is formed on the lower electrode 191. The capacitor dielectric film 192 may be formed along a profile of the lower electrode 191. The upper electrode 193 is formed on the capacitor dielectric film 192. The upper electrode 193 may cover an outer wall of the lower electrode 191. Although the upper electrode 193 is shown as a single film, it may have a multi-layer structure.

Each of the lower electrode 191 and the upper electrode 193 may include a doped semiconductor material, a conductive metal nitride (e.g., a titanium nitride, a tantalum nitride, a niobium nitride, a tungsten nitride, or the like), a metal (e.g., ruthenium, iridium, titanium, tantalum, or the like), a conductive metal oxide (e.g., an iridium oxide, a niobium oxide, or the like), and the like.

For example, the capacitor dielectric film 192 may include one of a silicon oxide, a silicon nitride, a silicon nitrate, a high permittivity material, and a combination thereof. In semiconductor devices according to some embodiments, the capacitor dielectric film 192 may include a stacked film structure in which a zirconium oxide, an aluminum oxide, and a zirconium oxide are sequentially stacked. In the semiconductor device according to an embodiment, the capacitor dielectric film 192 may include a dielectric film including hafnium (Hf). In the semiconductor device according to an embodiment, the capacitor dielectric film 192 may have a stacked structure of a ferroelectric material film and a paraelectric material film.

FIGS. 5 to 13 are intermediate step diagrams for explaining a manufacturing method of a semiconductor device according to embodiments. Contents overlapping with those described with reference to FIGS. 1 to 4 among description of the manufacturing method will be briefly described or omitted. For reference, FIGS. 5 to 13 are cross-sectional views corresponding to line A-A of FIG. 1.

Figure 5:
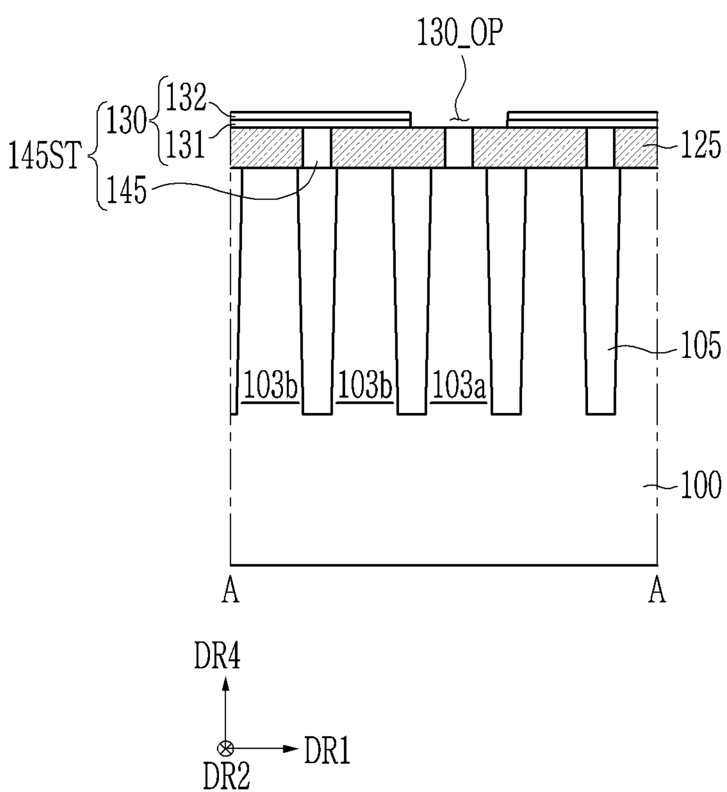
FIGS. 5 to 13 are diagrams of stages in a manufacturing method of a semiconductor device according to embodiments.

Referring to FIG. 5, the cell element separation film 105 may be formed within the substrate 100.

The substrate 100 may include the cell active region ACT defined by the cell element separation film 105. The cell active region ACT may have a bar shape extending in the third direction DR3.

For example, the cell gate electrode 112 may be formed within the substrate 100 and the cell element separation film 105. The cell gate electrode 112 may extend in the first direction DR1. The cell gate electrodes 112 may be spaced apart in the second direction DR2.

For example, the cell gate structure 110 extending in the first direction DR1 may be formed within the substrate 100 and the cell element separation film 105. The cell gate structure 110 may include the cell gate trench 115, the cell gate insulating film 111, the cell gate electrode 112, the cell gate capping pattern 113, and the cell gate capping conductive film 114.

For example, the cell gate electrode 112 may cross the cell active region ACT of FIG. 2. The cell active region ACT may be divided into the bit line connection region 103*a* and the storage connection region 103*b* by the cell gate electrode 112.

The cell active region ACT includes the bit line connection region 103*a* positioned at a center portion of the cell active region ACT and the storage connection region 103*b* positioned at an end portion of the cell active region ACT.

The node connection pad 125 and the pad separation pattern 145 may be formed on the substrate 100. The node connection pad 125 is connected to the storage connection region 103*b*. The node connection pad 125 may be separated by the pad separation pattern 145 extending in the first and second directions DR1 and DR2. In a plan view, the pad separation pattern 145 may have a grid shape.

The upper cell insulating film 130 is formed on the pad separation pattern 145. The upper cell insulating film 130 includes a bit line contact opening portion 130_OP. The bit line contact opening portion 130_OP overlaps the bit line connection region 103*a* in the fourth direction DR4.

The pad separation structure 145ST including the pad separation pattern 145 and the upper cell insulating film 130 is formed on the substrate 100.

Figure 6:
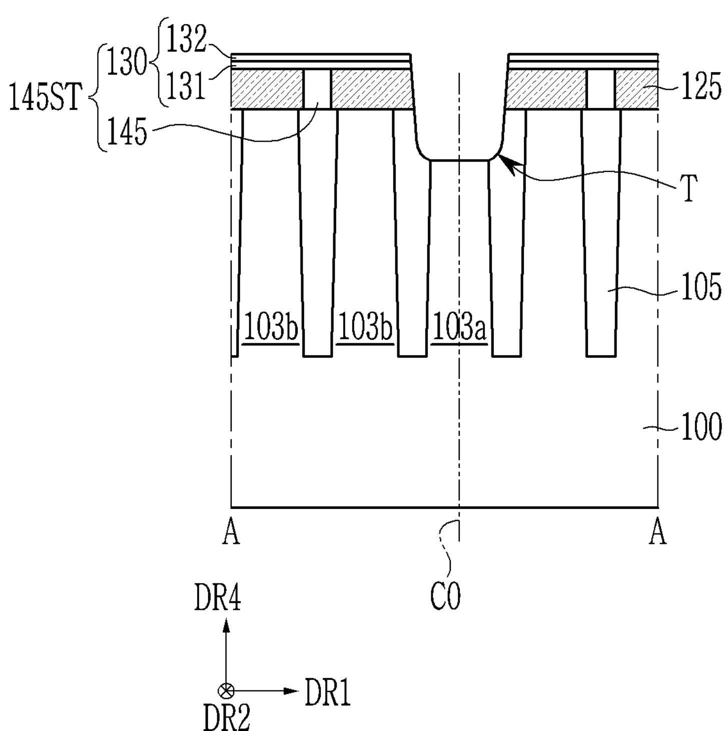

Referring to FIG. 6, a trench T is formed within the substrate 100. The pad separation pattern 145 and the node connection pad 125 exposed through the bit line contact opening portion 130_OP are etched.

Subsequently, the substrate 100, the cell element separation film 105, and the cell gate capping pattern 113 overlapping the bit line contact opening portion 130_OP may be removed. Accordingly, the trench T is formed at a region corresponding to the bit line contact opening portion 130_OP.

The trench T may pass through the upper cell insulating film 130 and the node connection pad 125, and may be formed within a portion of the cell element separation film 105. The trench T exposes a portion of the substrate 100. The trench T exposes the bit line connection region 103*a*.

Figure 7:
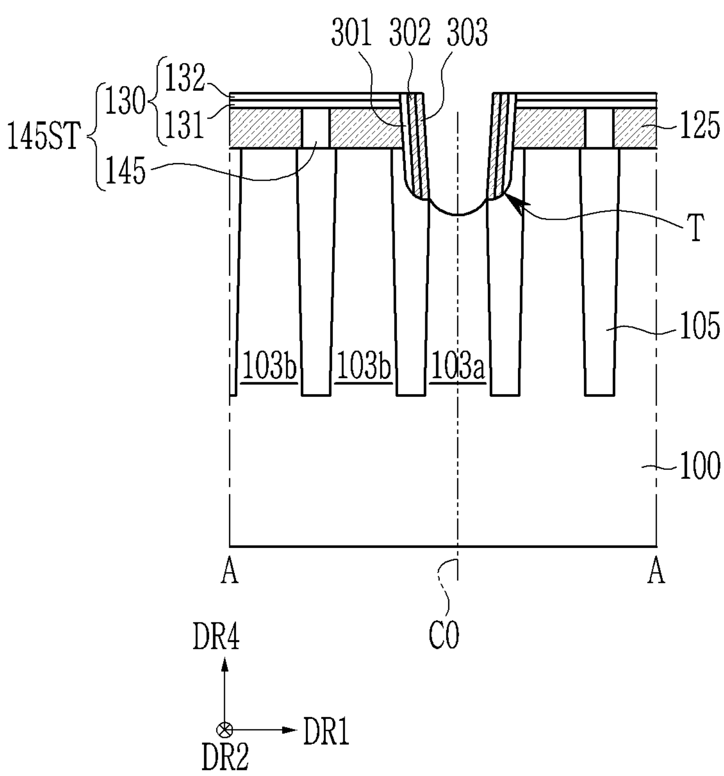

Referring to FIG. 7, the first to third contact spacers 301, 302, and 303 are sequentially formed within the trench T. A bottom surface of the trench T may be lowered while forming the first to third contact spacers 301, 302, and 303. While the first to third contact spacers 301, 302, and 303 are formed, the bottom surface of the trench T at a central axis CO of the trench T may be lowered so that the bottom surface of the trench T is curved.

In detail, the first contact spacer 301 is formed, e.g., conformally, along a sidewall of the trench T, e.g., the first contact spacer 301 may extend continuously along the entire sidewall of the trench T. The second contact spacer 302 is formed, e.g., conformally, on the first contact spacer 301. The first contact spacer 301 may include a nitride. The second contact spacer 302 may include an oxide. The third contact spacer 303 is formed, e.g., conformally, on the second contact spacer 302, e.g., so the second contact spacer 302 is between the first and third contact spacers 301 and 303. The third contact spacer 303 may include a nitride.

The first contact spacer 301 and the second contact spacer 302 may be formed by being patterned together, and the third contact spacer 303 may be formed through film deposition and etching processes after forming the first contact spacer 301 and the second contact spacer 302 first. A thickness of the third contact spacer 303 may be thinner than a thickness of the first contact spacer 301 or a thickness of the second contact spacer 302. For example, the thickness of the first contact spacer 301 or the second contact spacer 302 may be about 30 Å, and the thickness of the third contact spacer 303 may be about 10 Å. This may be because a part of the thickness of the third contact spacer 303 is removed so that the thickness of the third contact spacer becomes thin in an etching process performed when the third contact spacer 303 is formed.

Figure 8:
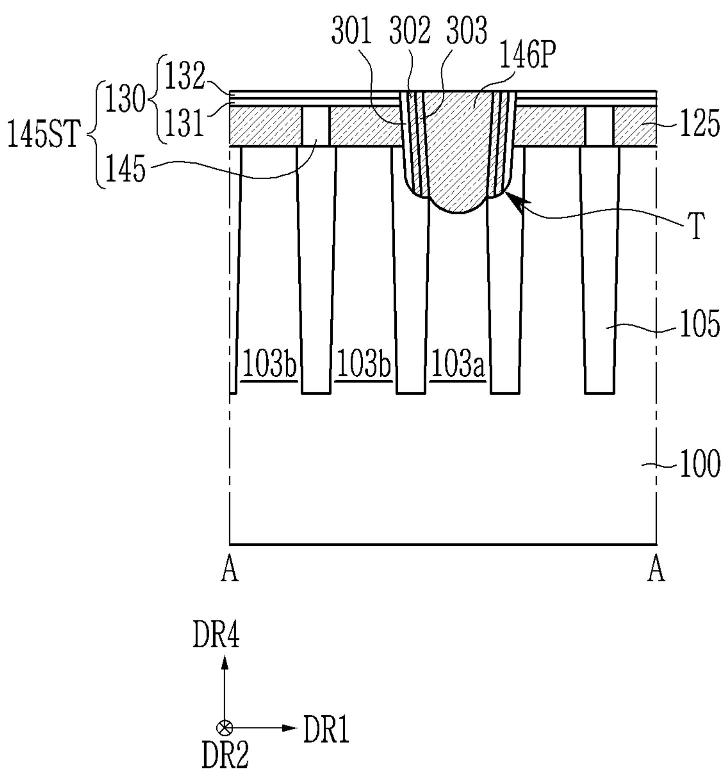

Referring to FIG. 8, a direct contact film 146P is formed within the trench T. The direct contact film 146P fills the trench T inside the third contact spacer 303, e.g., the direct contact film 146P may completely fill the trench T to be surrounded by the third contact spacer 303 inside the trench T. The direct contact film 146P may include a polysilicon.

Figure 9:
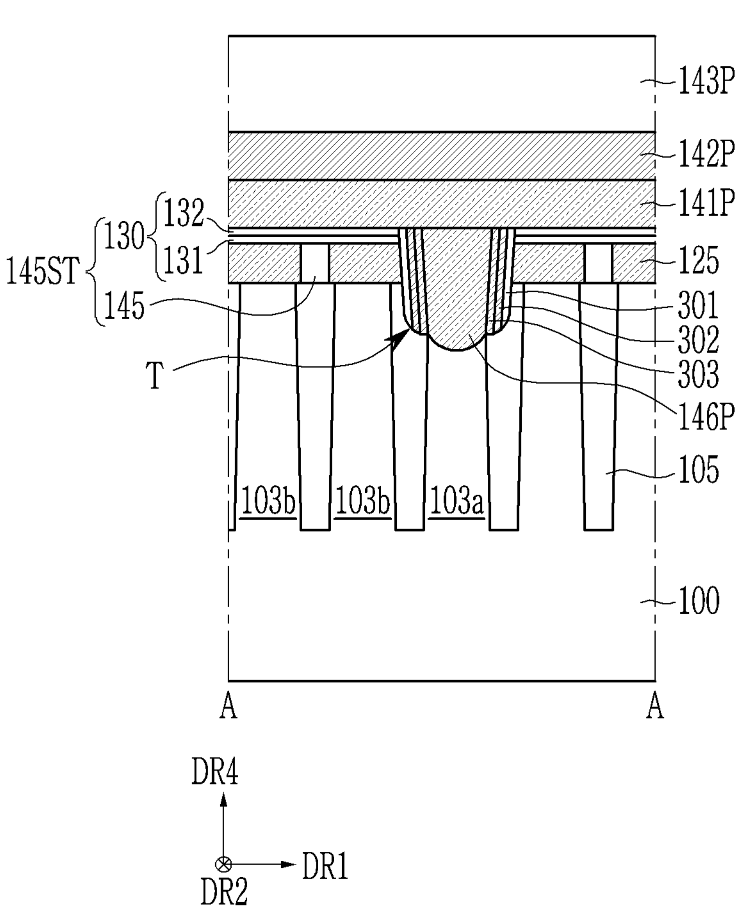

Referring to FIG. 9, first and second free cell conductive films 141P and 142P and a free cell line capping film 143P are sequentially formed on the upper cell insulating film 130 and the direct contact film 146P.

Figure 10:
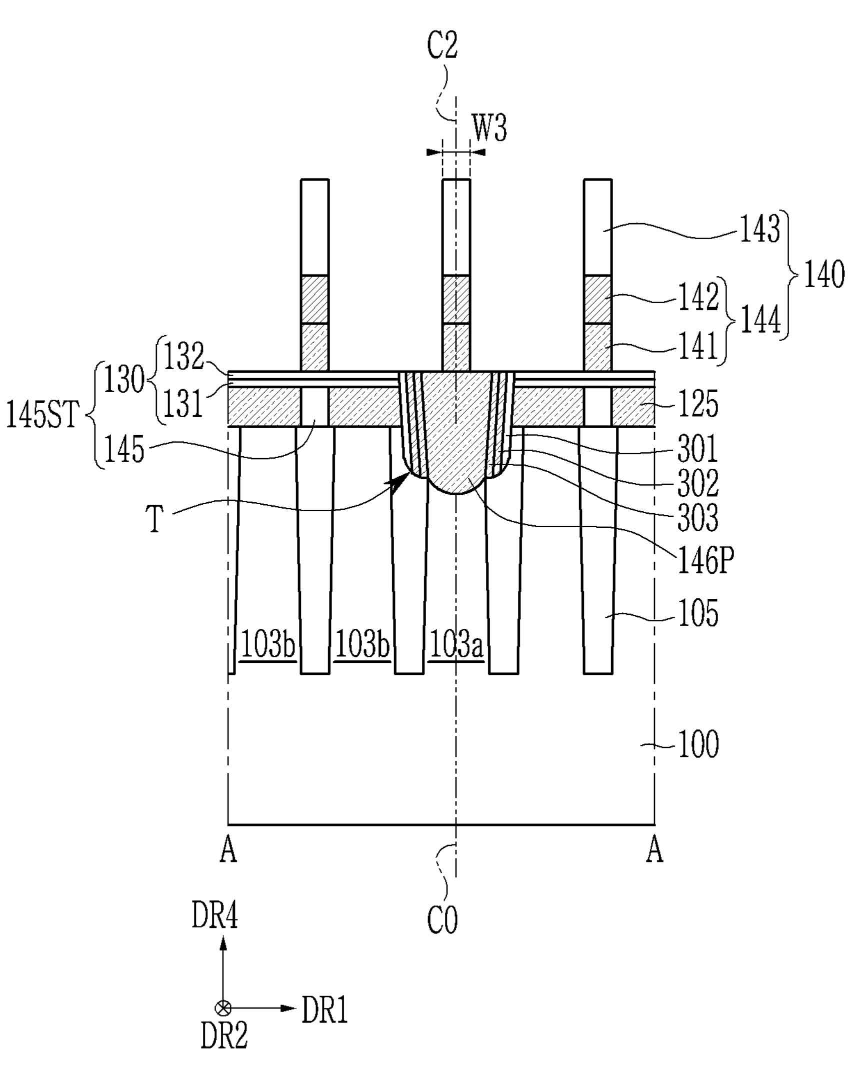

Referring to FIG. 10, the first and second free cell conductive films 141P and 142P and the free cell line capping film 143P may be patterned. Accordingly, the bit line structure 140 extending, e.g., continuously, in the second direction DR2 of FIG. 1 across the active regions ACT of FIG. 1 and the word lines WL of FIG. 1 may be formed. The bit line structure 140 may have a third width W3 in the first direction DR1.

As illustrated in FIGS. 3 and 10, the bit line structure 140 may be formed, e.g., directly, on the direct contact film 146P. As illustrated in FIG. 4, the bit line structure 140 may be formed, e.g., directly, on the upper cell insulating film 130 (e.g., in regions between adjacent ones of the direct contact films 146P). The bit line structure 140 may be formed on a central portion of the direct contact film 146P. A central axis C2 of the bit line structure 140 may overlap the central axis CO of the trench T. The central axis C2 of the bit line structure 140 may coincide, e.g., be collinear, with the central axis CO of the trench T. For example, a silicon nitride film and/or a silicon nitrate film and/or the like may be deposited and etched on the bit line structure 140 to form a protective film covering a side surface of the bit line structure 140.

Figure 11:
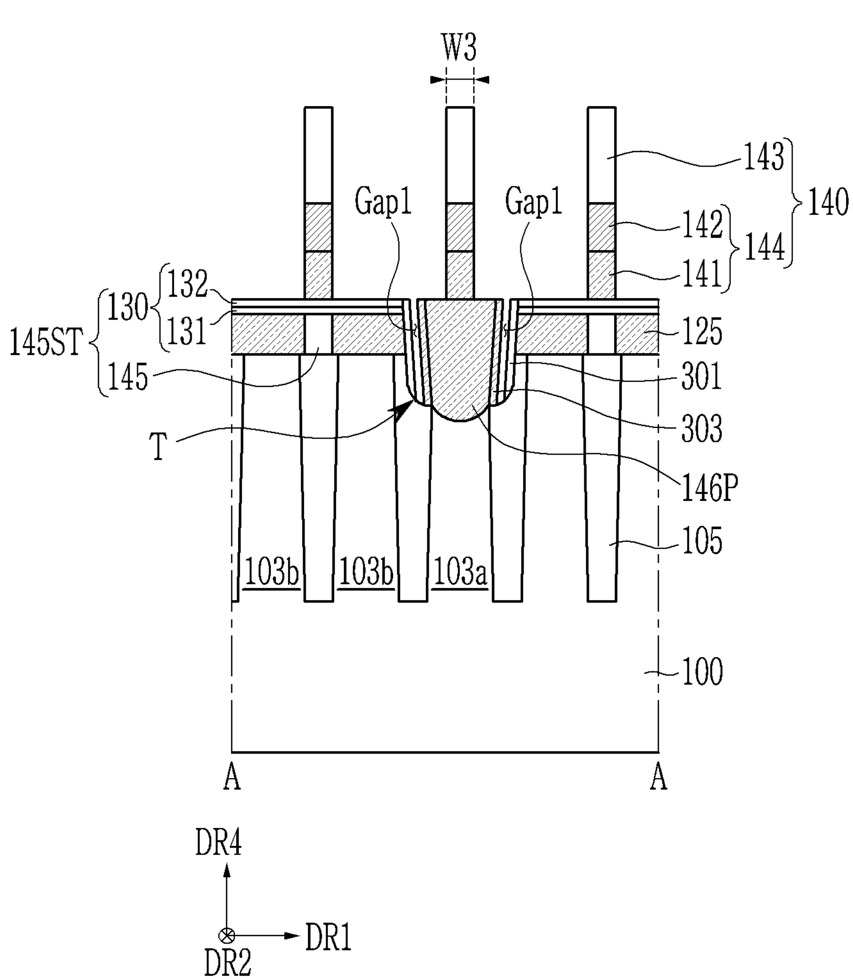

Referring to FIG. 11, the second contact spacer 302 is removed. A first gap Gap1 is formed at a position from which the second contact spacer 302 is removed, i.e., between the first and third contact spacers 301 and 303. The first gap Gap1 is formed between the direct contact film 146P and the third contact spacer 303.

For example, as discussed previously, portions of the second contact spacer 302 may remain directly below the bit line structure 140, e.g., shielded by the bit line structure 140, so portions of the second contact spacer 302 may be removed from regions exposed by the bit line structure 140, and therefore, the first gap Gap1 may be formed only in the regions exposed by the bit line structure 140. For example, the second contact spacer 302 may be removed using pulsed dry cleaning or the like.

Figure 12:
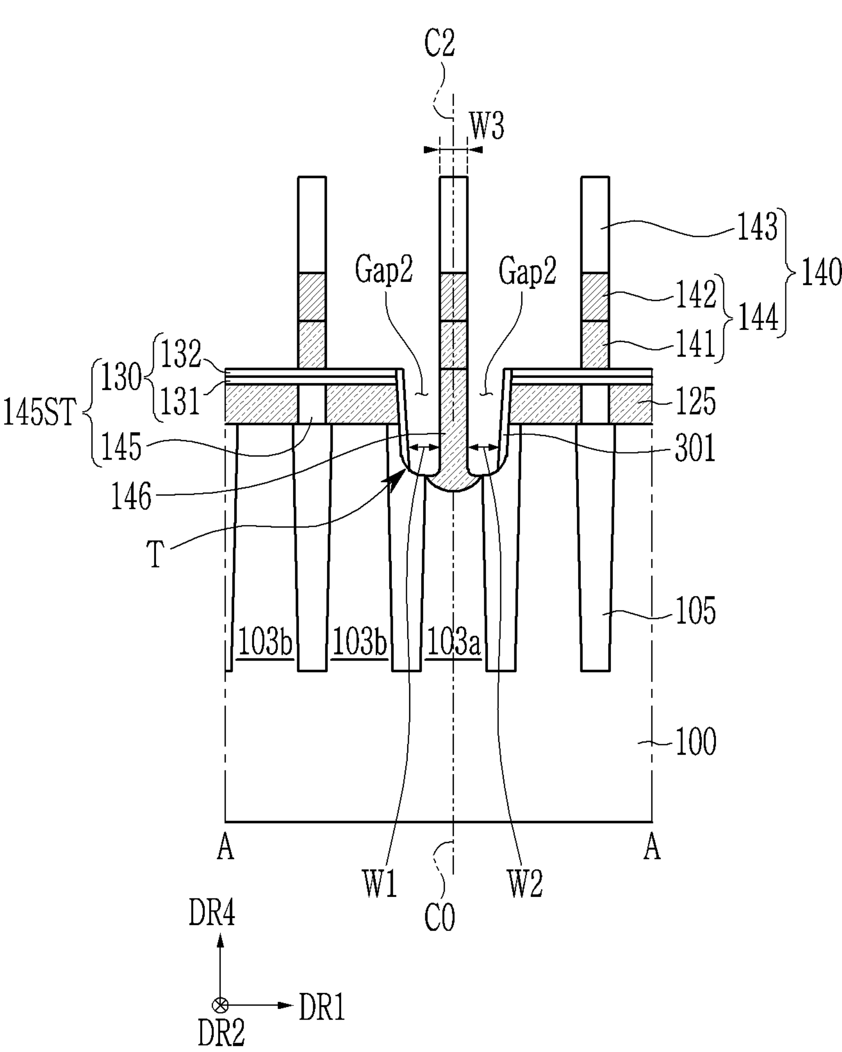

Referring to FIG. 12, a bit line contact 146 is formed by removing portions of the third contact spacer 303 and of the direct contact film 146P. For example, portions of the third contact spacer 303 exposed through the first gap Gap1 may be removed and portions (e.g., side and upper surfaces) of the direct contact film 146P may be removed. For example, portion of the third contact spacer 303 on the remained portions of the second contact spacer 302 may remain directly below the bit line structure 140.

In detail, the third contact spacer 303 exposed through the first gap Gap1 may be first removed using, e.g., ashing, stripping, and the like, and then portions of the direct contact film 146P may be etched through an exposed side surface and an exposed upper surface of the direct contact film 146P, e.g., using the bit line structure 140 as an etching mask. Accordingly, the first gap Gap1 extends (or expands) toward the direct contact film 146P to form a second gap Gap2. When the third contact spacer 303 exposed through the first gap Gap1 is removed, a portion of the first contact spacer 301 may also be removed to reduce a thickness of the first contact spacer 301, and the protective film covering the side surface of the bit line structure 140 may also be removed. Here, since the third contact spacer 303 is formed of a material (i.e., at least one of a silicon nitride (SiN), a silicon nitrate (SiON), a silicon carbonitride (SiCN), a silicon oxycarbide nitride (SiOCN), and a silicon carbide (SiOC)) that is different from that of the direct contact film 146P, it may be advantageous to reliably separate the bit line contact from another device by differently forming a polyoxide film or salt at an interface in a subsequent heat treatment process (e.g., a melting laser anneal (MLA) process or the like).

The second gap Gap2 may be separated into both sides by the bit line contact 146, e.g., one second gap Gap2 may be formed on each side of opposite sides of the bit line contact 146. For example, referring to FIG. 12, each second gap Gap2 may be between the bit line contact 146*a* and the first contact spacer 301 in the first direction DR1. For example, the bit line contact 146*a* may be in direct contact with the remaining portions of the third contact spacer 303 in the second direction DR2 in a region directly overlapped, e.g., vertically covered, by the by the bit line structure 140, e.g., each of the second and third contact spacers 302 and 303 may be separated into at least two parts, e.g., at least two discrete parts, within the trench at respective opposite sides of the bit line contact 146 in the second direction DR2.

A width of the second gap Gap2 may be constant at both, e.g., opposite, sides of the bit line contact 146. Specifically, at a cross-section of the trench T cut in a direction perpendicular to the substrate 100, the second gap Gap2 may be disposed at both sides of the bit line contact 146. A width W1 of the second gap Gap2 at one side of the bit line contact 146 may be the same as a width W2 of the second gap Gap2 at the other side of the bit line contact 146. In this case, the width W1 of the second gap Gap2 at the one side of the bit line contact 146 and the width W2 of the second gap Gap2 at the other side of the bit line contact 146 may refer to a distance from the bit line contact 146 to the first contact spacer 301, e.g., along the first direction DR1.

As described above, the first gap Gap1 may be formed using the second contact spacer 302 as a sacrificial film, and the third contact spacer 303 and the direct contact film 146P are etched through the first gap Gap1 to form the second gap Gap2. Thus, the second gap Gap2 may be formed so that the direct contact film 146P is reliably etched. In addition, even if an error occurs in alignment of the bit line structure 140, there is no difficulty in separating the bit line contact 146 from the other device.

While the direct contact film 146P is being etched, the bit line structure 140 may have a constant width. The bit line structure 140 on the bit line contact 146 may still have the third width W3.

Figure 13:
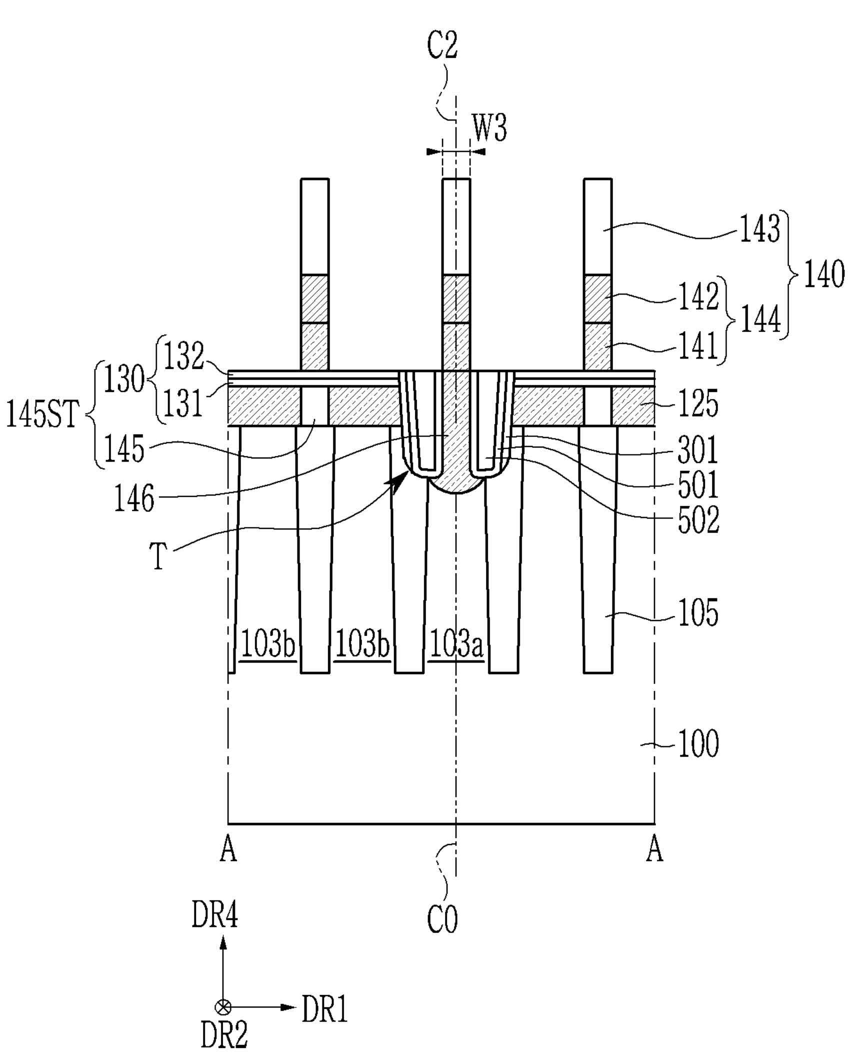

Referring to FIG. 13, the first gap insulating film 501 and the second gap insulating film 502 may be formed inside the second gap Gap2. Forming the first gap insulating film 501 and the second gap insulating film 502 may be omitted.

The first gap insulating film 501 may be a film formed along an inner surface of the second gap Gap2, and the second gap insulating film 502 may have a shape filling a groove formed by the first gap insulating film 501.

Referring back to FIG. 3, the bit line spacer 150 and the storage pad 160 may then be formed. In addition, the information storage part 190 connected to the storage pad 160 may be formed on the storage pad 160.

Figure 14:
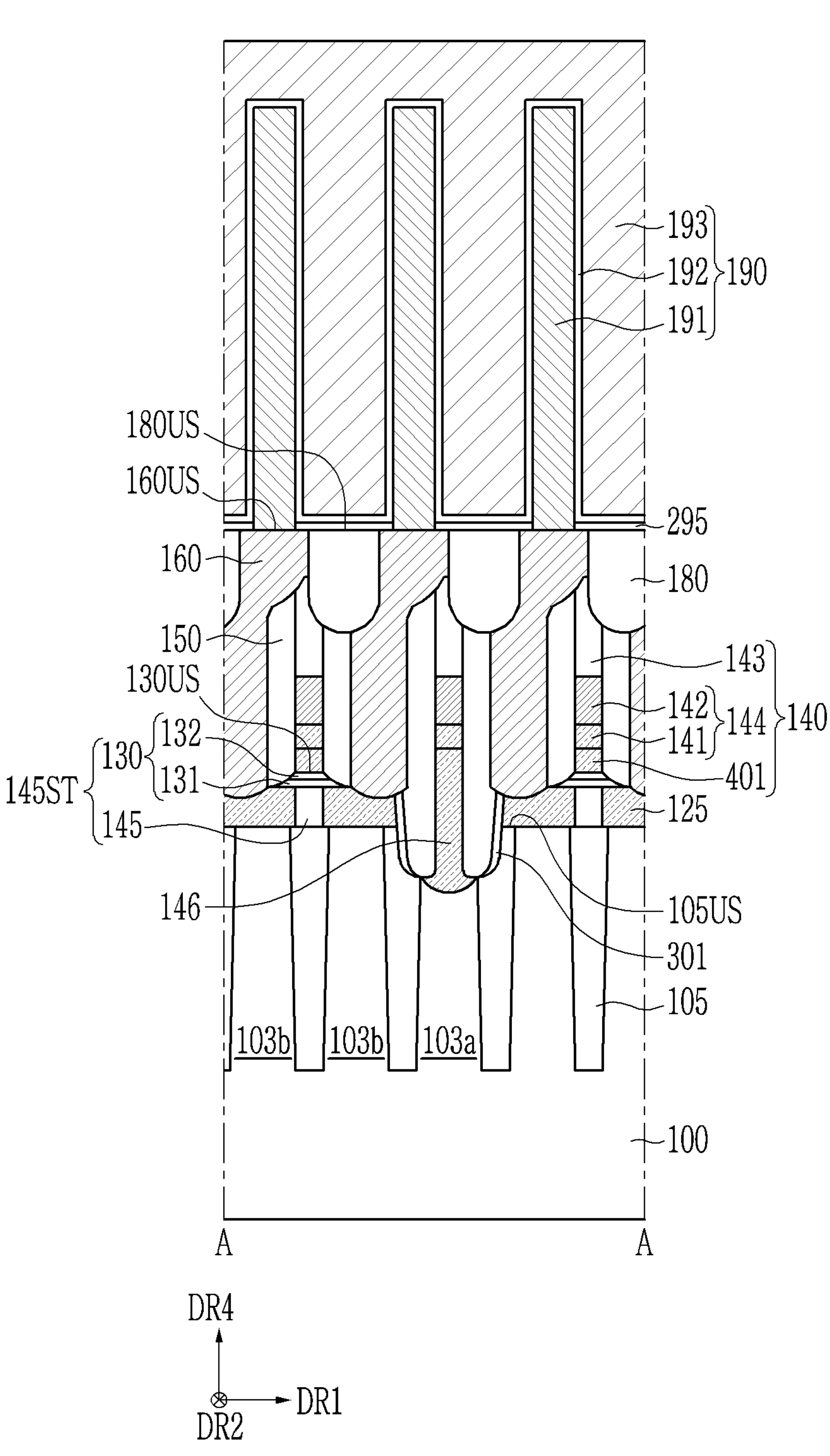
FIG. 14 is a cross-sectional view of a semiconductor device according to another embodiment.
Figure 15:
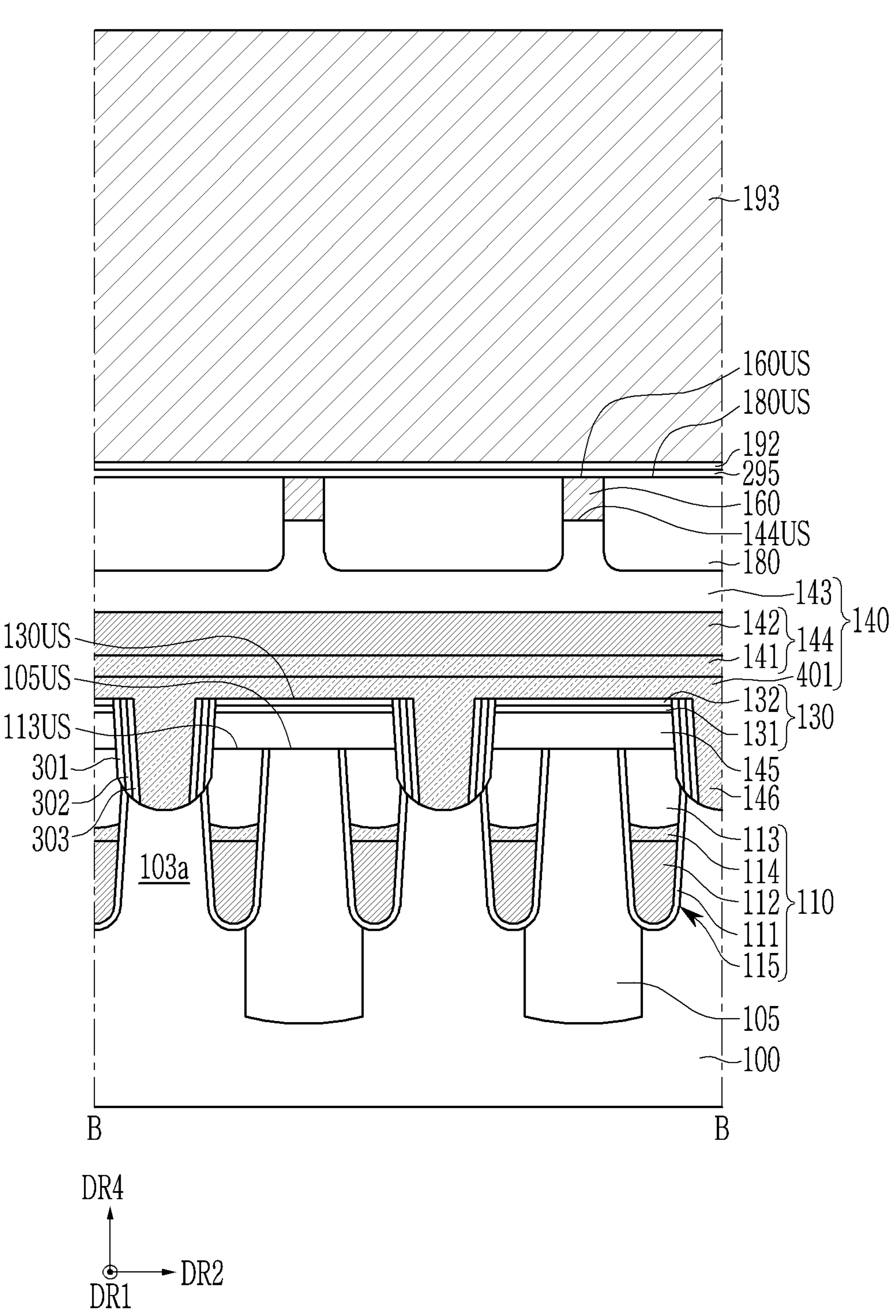
FIG. 15 is a cross-sectional view of a semiconductor device according to another embodiment.

FIG. 14 is a cross-sectional view of a semiconductor device according to another embodiment and corresponds to FIG. 3. FIG. 15 is a cross-sectional view of a semiconductor device according to another embodiment and corresponds to FIG. 4. For convenience of explanation, the following description will focus on differences from those described with reference to FIGS. 1 to 4.

Referring to FIG. 14, the bit line spacer 150 may be extended and positioned between the bit line contact 146 and the first contact spacer 301. When FIG. 14 is compared with FIG. 3, the first and second gap insulating films 501 and 502 do not exist, and the bit line spacer 150 fills a position where the first and second gap insulating films 501 and 502 do not exist.

In addition, referring to FIGS. 14 and 15, the bit line structure 140 may further include a cell poly line 401. The cell poly line 401 may be formed of the same material as the bit line contact 146. The cell poly line 401 or the bit line contact 146 may include a poly-silicon.

The semiconductor devices of FIGS. 14 and 15 may be obtained by leaving a polysilicon layer on the upper cell insulating film 130 in a process of FIG. 5 described above and by patterning the polysilicon layer together in a process of forming the bit line structure 140 to form the cell poly line 401. The polysilicon layer left on the upper cell insulating film 130 may be used as an etching mask forming the trench T in FIG. 6.

In addition, the semiconductor devices of FIGS. 14 and 15 may be obtained by omitting a process of FIG. 13 described above.

By way of summation and review, embodiments provide a semiconductor device including a bit line contact with improved reliability. Embodiments also provide a method of manufacturing a semiconductor device including a bit line contact with improved yield.

That is, the semiconductor device according to embodiments may have a self-aligned bit line direct contact to improve device reliability. In addition, the manufacturing method of the semiconductor device according to the embodiment may reduce a defect of a bit line direct contact using a bit line contact triple film structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor device, comprising:

a substrate that includes an element separation film, an active region defined by the element separation film and arranged in a first direction, and a trench positioned across the active region and the element separation film;

a bit line contact that is positioned within the trench and is connected to the active region;

a bit line structure that is connected to the substrate through the bit line contact and that extends in a second direction different from the first direction across the active region; and a first contact spacer, a second contact spacer, and a third contact spacer within the trench and around the bit line contact, the first contact spacer being continuous around a sidewall of the bit line contact within the trench and surrounding the entire perimeter of the bit line contact, and each of the second contact spacer and the third contact spacer being separated into at least two discrete parts within the trench, wherein the first contact spacer is spatially separated from the bit line contact.

2. The semiconductor device as claimed in claim 1, wherein the second contact spacer and the third contact spacer are only at positions overlapping the bit line structure.

3. The semiconductor device as claimed in claim 2, further comprising a gap insulating film positioned within the trench.

4. The semiconductor device as claimed in claim 3, wherein the gap insulating film is positioned between the first contact spacer and the bit line contact.

5. The semiconductor device as claimed in claim 4, wherein the gap insulating film includes:

a first gap insulating film positioned between the first contact spacer and the bit line contact; and a second gap insulating film between the first gap insulating film and the bit line contact.

6. The semiconductor device as claimed in claim 5, wherein the first gap insulating film includes a silicon oxide.

7. The semiconductor device as claimed in claim 6, wherein the second gap insulating film includes at least one of a silicon nitride, a silicon nitrate, a silicon carbonitride, a silicon oxycarbide nitride, and a silicon carbide.

8. The semiconductor device as claimed in claim 1, wherein the second contact spacer includes a silicon oxide.

9. The semiconductor device as claimed in claim 8, wherein each of the first contact spacer and the third contact spacer includes at least one of a silicon nitride, a silicon nitrate, a silicon carbonitride, a silicon oxycarbide nitride, and a silicon carbide.

10. The semiconductor device as claimed in claim 1, further comprising a gap insulating film positioned within the trench.

11. The semiconductor device as claimed in claim 10, wherein the gap insulating film is disposed in a space between the first contact spacer and the bit line contact.

* * * * *